(12) United States Patent
Kikuchi

(10) Patent No.: US 10,588,228 B2
(45) Date of Patent: Mar. 10, 2020

(54) INFORMATION PROCESSING APPARATUS

(71) Applicant: Sharp Kabushiki Kaisha, Sakai, Osaka (JP)

(72) Inventor: Masayuki Kikuchi, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 127 days.

(21) Appl. No.: 16/068,903

(22) PCT Filed: Mar. 31, 2017

(86) PCT No.: PCT/JP2017/013514
§ 371 (c)(1),
(2) Date: Jul. 10, 2018

(87) PCT Pub. No.: WO2018/179309
PCT Pub. Date: Oct. 4, 2018

(65) Prior Publication Data
US 2019/0364682 A1   Nov. 28, 2019

(51) Int. Cl.
G06F 1/16        (2006.01)
H05K 5/02       (2006.01)
E05D 7/00       (2006.01)
H05K 5/00       (2006.01)
G02F 1/1333    (2006.01)
H01L 51/00     (2006.01)

(52) U.S. Cl.
CPC ......... *H05K 5/0226* (2013.01); *E05D 7/0009* (2013.01); *H05K 5/0017* (2013.01); *E05Y 2900/606* (2013.01); *G02F 1/133305* (2013.01); *H01L 51/0097* (2013.01)

(58) Field of Classification Search
CPC .... G06F 1/1615; G06F 1/1616; G06F 1/1652; H05K 5/0017; H05K 5/0226; E05D 7/0009
USPC .......................... 361/679.27, 679.54, 679.55
See application file for complete search history.

(56) References Cited

U.S. PATENT DOCUMENTS

| 2012/0236484 | A1* | 9/2012 | Miyake | G06F 1/1616 |
| | | | | 361/679.01 |
| 2014/0226275 | A1 | 8/2014 | Ko et al. | |
| 2014/0328041 | A1 | 11/2014 | Rothkopf et al. | |
| 2015/0055287 | A1* | 2/2015 | Seo | G06F 1/1652 |
| | | | | 361/679.27 |
| 2015/0261259 | A1 | 9/2015 | Endo et al. | |
| 2017/0322598 | A1* | 11/2017 | Fujimoto | G06F 1/1643 |

(Continued)

FOREIGN PATENT DOCUMENTS

| JP | 2014-62644 A | 4/2014 |
| JP | 2014-161009 A | 9/2014 |
| JP | 2016-75884 A | 5/2016 |

OTHER PUBLICATIONS

Official Communication issued in International Patent Application No. PCT/JP2017/013514, dated Jun. 13, 2017.

*Primary Examiner* — Anthony Q Edwards
(74) *Attorney, Agent, or Firm* — Keating & Bennett, LLP

(57) ABSTRACT

A length of an expandable mechanism of a hinge in a case where a first face of a first housing and a second face of a second housing are disposed facing each other is longer than a length of the expandable mechanism of the hinge in a case where a back face of the first face of the first housing and a back face of the second face of the second housing are disposed facing each other.

15 Claims, 8 Drawing Sheets

(56) References Cited

U.S. PATENT DOCUMENTS

2018/0109871 A1* 4/2018 Huh .................... H05K 5/0217
2019/0364682 A1* 11/2019 Kikuchi ................ E05D 7/0009

* cited by examiner

DUAL-FACE MODE    LARGE-SCREEN MODE    CLOSED STATE

INFORMATION PROCESSING APPARATUS

TECHNICAL FIELD

The disclosure relates to an information processing apparatus including a flexible display body (flexible display panel) and, more specifically, to a foldable information processing apparatus including a flexible display panel.

BACKGROUND ART

Information processing apparatuses, such as smartphone and tablet, that includes a flexible display panel, such as a flexible organic EL panel or a reflective liquid crystal display panel not including backlight, can be used while bending or unbending and making flat the flexible display panel itself, and are thus attracting much attention.

PTL 1 discloses a flexible mobile terminal apparatus including a flexible display panel.

FIGS. 8A to 8D are drawings illustrating a schematic configuration of a flexible mobile terminal apparatus 100 including a flexible display panel 300 disclosed in PTL 1.

As illustrated in FIG. 8A and FIG. 8C, the flexible mobile terminal apparatus 100 includes a terminal apparatus body 110, a folding portion 160, a flexible display panel 300, and slides 130 and 140. The terminal apparatus body 110 includes an upper end sliding member including the slide 130 and a lower end sliding member including the slide 140, respectively, on an upper part of the terminal apparatus body 110 and on a lower part of the terminal apparatus body 110 with respect to the folding portion 160. The upper sliding member and the lower sliding member allow the flexible mobile terminal apparatus 300 to slide when bending or folding the flexible mobile terminal apparatus 100.

As illustrated in FIG. 8B and FIG. 8D, the upper end sliding member including the slide 130 at the upper end of the upper part of the terminal apparatus body 110 includes the slide 130, a slot 120 configured to limit a slidable range of the slide 130, and guide members 131, 132 configured to guide the slide 130 without causing separation. The lower end sliding member including the slide 140 has the same configuration.

As described above, according to the flexible mobile terminal apparatus 100 disclosed in PTL 1, the upper end sliding member and the lower end sliding member allow the flexible display 300 to slide, thus preventing separation from the terminal apparatus body 110 and breakage of the flexible display 300 adhered to the terminal apparatus body 110 when bending or folding the flexible mobile terminal apparatus 100.

CITATION LIST

Patent Literature

PTL 1: JP 2014-161009 A (published Sep. 4, 2014)

SUMMARY

Technical Problem

However, the flexible mobile terminal apparatus 100 disclosed in PTL 1 has a problem in that the upper end sliding member and the lower end sliding member are required to be provided on the terminal apparatus body 110 in addition to the folding portion 160. Thus, the configuration of the flexible mobile terminal apparatus 100 may become complicated and unstable movement of the flexible display pane 300 may occur due to the upper end sliding member and the lower end sliding member allowing the flexible mobile display panel 300 to slide.

In view of such problems, an object of the disclosure is to provide an information processing apparatus that eliminates the need for a mechanism for sliding a flexible display body (flexible display panel), avoid unstable movement of the flexible display body, and prevent breakage of the flexible display body due to an excessive stress imparted on a bendable portion of the flexible display body or due to an excessive tension applied to the flexible display body.

Solution to Problem

In order to solve the above-described problems, an information processing apparatus of the disclosure includes a first housing; a second housing; a hinge configured to couple the first housing and the second housing; and a flexible display body disposed extending over and across a first face of the first housing and a second face of the second housing, wherein the hinge includes a first rotation mechanism provided at a portion to be coupled to the first housing, a second rotation mechanism provided at a portion to be coupled to the second housing, and an expandable mechanism configured to determine a distance between the first rotation mechanism and the second rotation mechanism, and a length of the expandable mechanism in a case where the first face of the first housing and the second face of the second housing are disposed facing each other is longer than a length of the expandable mechanism in a case where a face, in the first housing, opposite the first face of the first housing where the flexible display body is provided, and a face, in the second housing, opposite the second face of the second housing where the flexible display body is provided, are disposed facing each other.

In this configuration, as the length of the expandable mechanism in the case where the first face of the first housing and the second face of the second housing are disposed facing each other is longer than the length of the expandable mechanism in the case where the face, in the first housing, opposite the first face of the first housing where the flexible display body is provided, and the face, in the second housing, opposite the second face of the second housing where the flexible display body is provided, are disposed facing each other, breakage of the flexible display body due to an excessive stress imparted on a bendable portion of the flexible display body disposed extending over and across the first face of the first housing and the second face of the second housing or due to an excessive tension applied to the flexible display body can be prevented.

In this configuration, as breakage of the flexible display body due to an excessive stress imparted on the bendable portion of the flexible display body disposed extending over and across the first face of the first housing and the second face of the second housing or due to an excessive tension applied to the flexible display body can be prevented by the hinge configured to couple the first housing and the second housing, the need for a mechanism allowing for the flexible display body to slide may be eliminated, and unstable movement of the flexible display body may be avoided.

Advantageous Effects of the Disclosure

According to an aspect of the disclosure, an information processing apparatus can be provided in which the need for providing the mechanism allowing for the flexible display body to slide is eliminated, unstable movement of the flexible display body is avoided, and breakage of the flexible display body due to an excessive stress imparted on the bendable portion of the flexible display body or due to the excessive tension applied to the flexible display body is prevented.

BRIEF DESCRIPTION OF DRAWINGS

FIG. 2A is a drawing illustrating the information processing apparatus viewed from a front face side of a first housing and a second housing; and FIG. 2B is a drawing illustrating the information processing apparatus viewed from a flexible display panel side.

DESCRIPTION OF EMBODIMENTS

Figure 1A:
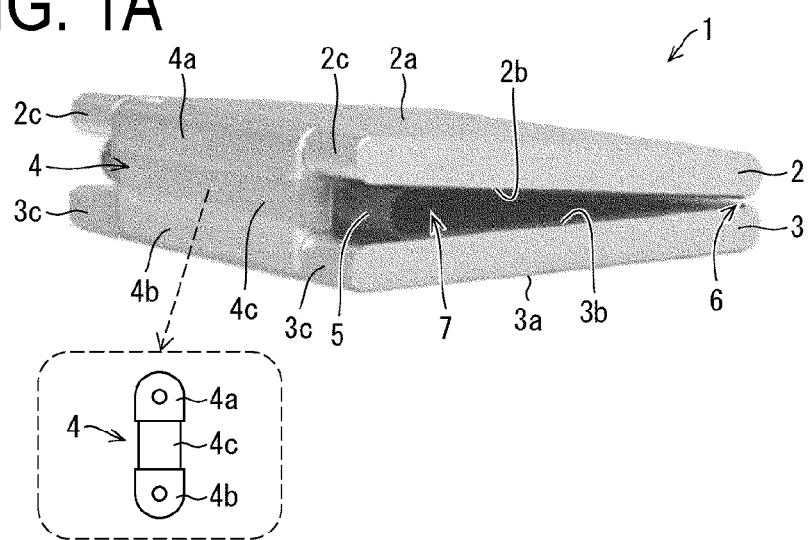
FIGS. 1A and 1B are drawings illustrating a closed state of an information processing apparatus including a flexible display panel.

A description follows regarding embodiments of the disclosure, with reference to FIGS. 1A to 7D. Hereinafter, components having the same functions as those described in a specific embodiment are denoted by the same reference numerals and description thereof may be omitted for convenience of description.

First Embodiment

A first embodiment of the disclosure will be described with reference to FIGS. 1A to 4D.

Figure 1B:
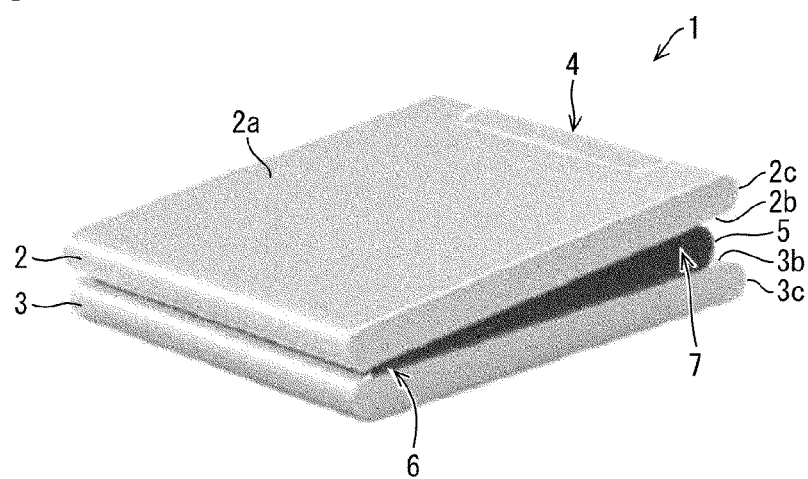

FIG. 1A is a drawing illustrating an information processing apparatus 1 including a flexible display panel 5 in a closed state viewed from a hinge 4 side, and FIG. 1B is a drawing illustrating the information processing apparatus 1 including the flexible display panel 5 (flexible display body) in a closed state viewed from an opposite side from the hinge 4.

As illustrated in the drawings, the information processing apparatus 1 includes a first housing 2, a second housing 3, the hinge 4 configured to couple the first housing 2 and the second housing 3, and the flexible display panel 5 provided extending over and across a first face 2b of the first housing 2 and a second face 3b of the second housing 3.

A back face 2a is a face opposite the first face 2b, where the flexible display panel 5 is provided, of the first housing 2, and a back face 3a is a face opposite the second face 3b, where the flexible display panel 5 is provided, of the second housing 3.

In this embodiment, as the flexible display panel 5 is fixed to the first housing 2 and the second housing 3 via adhesive layers (not illustrated) provided on the first face 2b of the first housing 2 and the second face 3b of the second housing 3, unstable movement of the flexible display panel 5 is prevented.

The first housing 2 includes a side face 2c on the hinge 4 side, the second housing 3 includes a side face 3c on the hinge side 4, and the side face 2c and the side face 3c include recessed portions to allow engagement of the hinge 4.

The hinge 4 includes a first rotation mechanism 4a provided at a portion to be coupled with the first housing 2, a second rotation mechanism 4b provided at a portion to be coupled with the second housing 3, and an expandable mechanism 4c configured to determine a distance between the first rotation mechanism 4a and a second rotation mechanism 4b.

In this embodiment, the first rotation mechanism 4a of the hinge 4 engages with the recessed portion formed in the side face 2c to enable the first housing 2 to move about a rotation axis of the first rotation mechanism 4a of the the hinge 4 with respect to the hinge 4. On the other hand, the second rotation mechanism 4b of the hinge engages with the recessed portion formed in the side face 3c to enable the second housing 3 to move about a rotation axis of the second rotation mechanism 4b of the hinge 4 with respect to the hinge 4.

The first housing 2 and the second housing 3 accommodate a battery to supply power to the information processing apparatus 1 as a whole, wired and wireless communication devices, a CPU (Central Processing Unit), various memories, and the like as needed.

Although an example in which a flexible organic EL panel is used as the flexible display panel 5 is described in this embodiment, the flexible display panel 5 is not limited thereto, and, for example, a flexible reflective liquid crystal display panel not including backlight may be employed.

In this embodiment, as illustrated in FIGS. 1A and 1B, the length of the expandable mechanism 4c of the hinge 4 of the information processing apparatus 1 is longest in a case where the first face 2b of the first housing 2 and the second face 3b of the second housing 3 are disposed facing each other. Thus, an edge of the first face 2b of the first housing 2 on a side farther from the hinge 4 and an edge of the second face 3b of the second housing 3 on a side farther from the hinge 4 come into contact with each other and form a contact portion 6, while a portion of the first face 2b of the first housing 2 on a side closer to the hinge 4 of the first face 2b of the first housing 2 and a portion of side do not come into contact with each other and form a cavity 7. The cavity 7 is maintained by the expandable mechanism 4c of the hinge 4.

According to this configuration, breakage due to an excessive stress being imparted on a bendable portion of the flexible display panel 5 disposed to extend over and across the first face 2b of the first housing 2 and the second face 3b of the second housing 3 can be prevented.

Figure 2A:
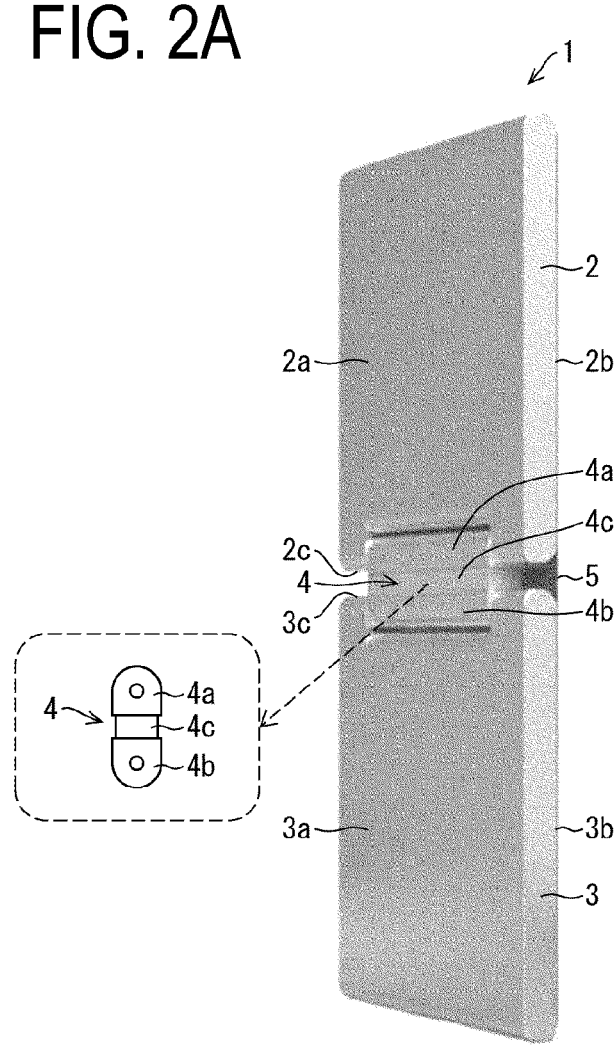
FIGS. 2A and 2B are drawings illustrating a case where the information processing apparatus illustrated in FIGS. 1A and 1B is completely opened into a large-screen mode.
Figure 2B:
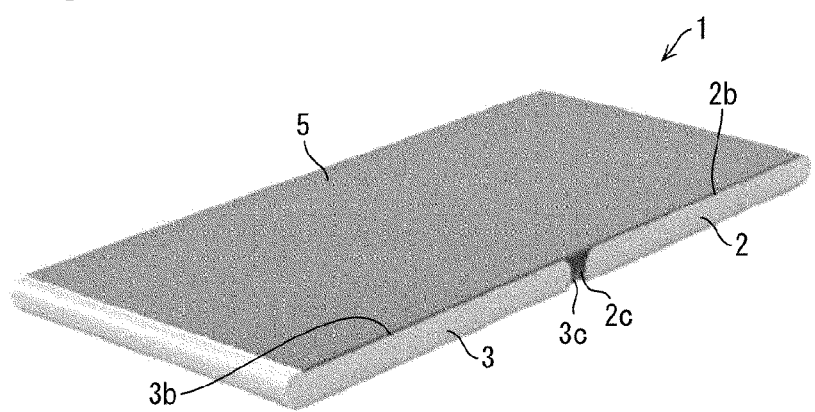

FIGS. 2A and 2B are drawings illustrating a case of a large-screen mode in which the information processing apparatus 1 illustrated in FIGS. 1A and 1B is completely opened. FIG. 2A is a drawing illustrating the information processing apparatus 1 viewed from the front face 2a side of the first housing 2 and the front face 3a side of the second housing 3, and FIG. 2B is a drawing illustrating the information processing apparatus 1 viewed from the flexible display panel 5 side.

As illustrated in FIG. 2A and FIG. 2B, the large-screen mode in which the information processing apparatus 1 is completely opened is a state in which the first housing 2 and the second housing 3 are disposed along a direction of change in length of the expandable mechanism 4c (vertical direction in FIG. 2A) with the first face 2b of the first housing 2 and the second face 3b of the second housing 3 disposed parallel to each other, and the flexible display panel 5 disposed extending over and across the first face 2b of the first housing 2 and the second face 3b of the second housing 3 being completely opened.

In this embodiment, as illustrated in FIG. 2A, a length of the expandable mechanism 4c of the hinge 4 in a case where the information processing apparatus 1 is in a large-screen mode is shorter than a length of the expandable mechanism 4c in a case where the first face 2b of the first housing 2 and the second face 3b of the second housing 3 are disposed facing each other, and is longer than the length of the expandable mechanism 4c in a case where the front face 2a of the first housing 2 and the front face 3a of the second housing 3 are disposed facing each other. Thus, even in the case where the information processing apparatus 1 is in the large-screen mode, breakage of the flexible display panel 5 due to an excessive stress imparted on the bendable portion of the flexible display panel 5 disposed extending over the first face 2b of the first housing and the second face 3b of the second housing 3 or due to an excessive tension applied to the flexible display panel 5 can be prevented.

Figure 3A:
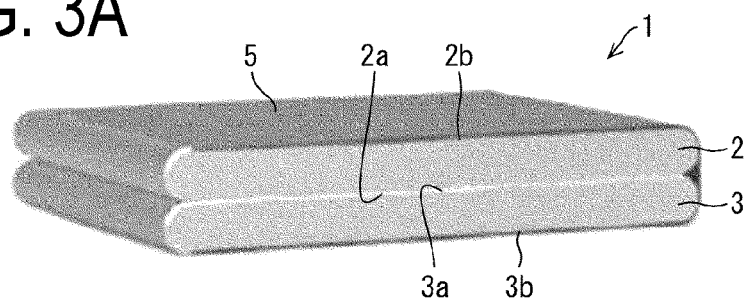
FIGS. 3A and 3B are drawings illustrating a case where the information processing apparatus illustrated in FIGS. 1A and 1B is in a dual-face mode.
Figure 3B:
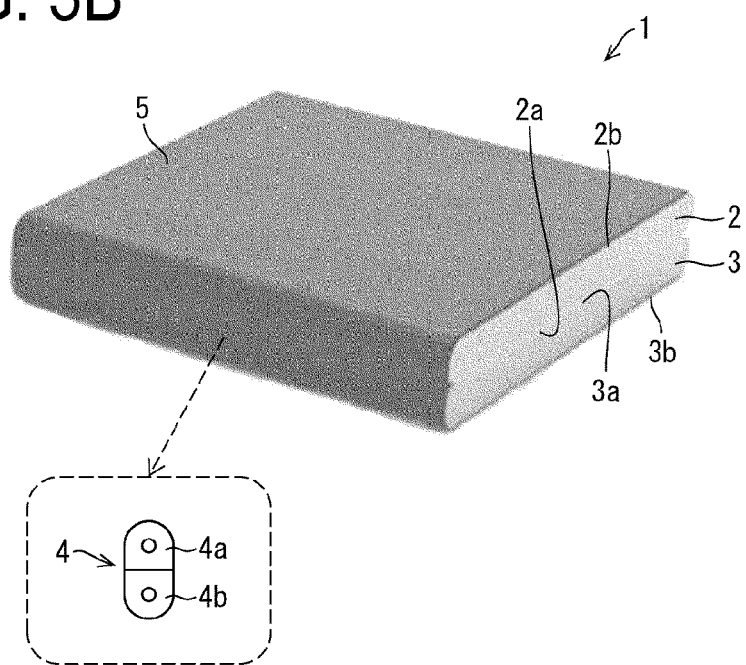

FIG. 3A and FIG. 3B are drawings illustrating a case where the information processing apparatus 1 is in the dual-face mode.

As illustrated in FIG. 3A and FIG. 3B, the dual-face mode of the information processing apparatus 1 is a state in which the first housing 2 and the second housing 3 are disposed with the front face 2a of the first housing 2 and the front face 3a of the second housing 3 coming into contact with each other, and the flexible display panel 5 disposed extending over and across the first face 2b of the first housing 2 and the second face 3b of the second housing 3 being disposed to cover the first housing 2 and the second housing 3.

In this embodiment, as illustrated in the drawings, the length of the expandable mechanism 4c of the hinge 4 is shortest in the case where the information processing apparatus 1 is in the dual-face mode. Thus, breakage of the flexible display panel 5 due to an excessive tension being applied to the flexible display panel 5 disposed extending over and across the first face 2b of the first housing 2 and the second face 3b of the second housing 3 can be prevented.

Figure 4A:
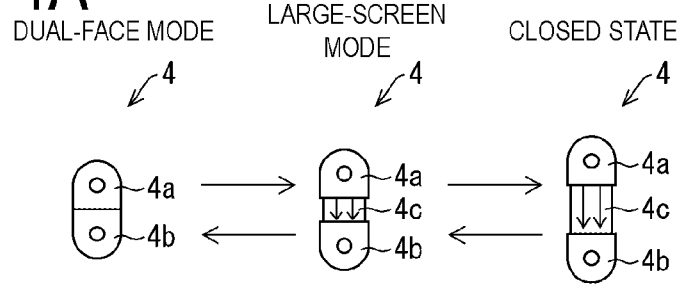
FIG. 4A is a drawing illustrating changes in length of an expandable mechanism of a hinge in cases where the information processing apparatus illustrated in FIGS. 1A and 1B is in the dual-face mode, the large-screen mode, and the closed state.
Figure 4B:
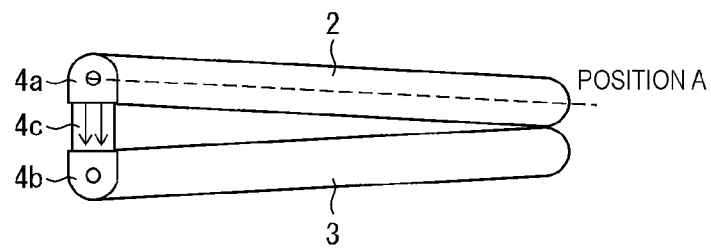
FIG. 4B is a drawing illustrating an arrangement position of the first housing with respect to a first rotation mechanism of the hinge in the case where the information processing apparatus is in the closed state.
Figure 4C:
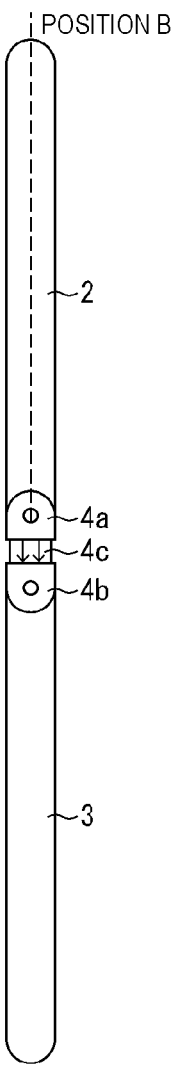
FIG. 4C is a drawing illustrating an arrangement position of the first housing with respect to the first rotation mechanism of the hinge in the case where the information processing apparatus is in the large-screen mode.
Figure 4D:
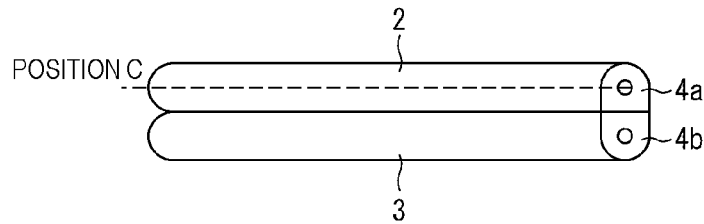
FIG. 4D is a drawing illustrating an arrangement position of the first housing with respect to the first rotation mechanism of the hinge in the case where the information processing apparatus is in the dual-face mode.

FIG. 4A is a drawing illustrating changes in length of the expandable mechanism 4c of the hinge 4 in cases where the information processing apparatus 1 is in the dual-face mode, the large-screen mode, and the closed state, FIG. 4B is a drawing illustrating an arrangement position of the first housing 2 with respect to the first rotation mechanism 4a of the hinge 4 in the case where the information processing apparatus 1 is in the closed state, FIG. 4C is a drawing illustrating an arrangement position of the first housing 2 with respect to the first rotation mechanism 4a of the hinge 4 in the case where the information processing apparatus 1 is in the large-screen mode, and FIG. 4D is a drawing illustrating an arrangement position of the first housing 2 with respect to the first rotation mechanism 4a of the hinge 4 in the case where the information processing apparatus 1 is in the dual-face mode.

As illustrated in FIGS. 4A to 4D, the hinge 4 provided on the information processing apparatus 1 of this embodiment is configured to determine the length of the expandable mechanism 4c in accordance with an arrangement position of the first housing 2 with respect to the hinge 4 (a position A in FIG. 4B, a position B in FIG. 4C, and a position C in FIG. 4D), and the length of the expandable mechanism 4c projecting from the first rotating mechanism 4a changes continuously in accordance with the change in the arrangement position of the first housing 2 with respect to the hinge 4, as illustrated in FIG. 4A.

In other words, in a case where the arrangement position of the first housing 2 with respect to the first rotation mechanism 4a of the hinge 4 changes from the position A in FIG. 4B through the position B in FIG. 4C to the position C in FIG. 4D, the length of the expandable mechanism 4c projecting from the first rotation mechanism 4a continuously decreases from the right to the left as indicated by arrows in FIG. 4A.

In contrast, in a case where the arrangement position of the first housing 2 with respect to the first rotation mechanism 4a of the hinge 4 changes from the position C in FIG. 4D through the position B in FIG. 4C to the position A in FIG. 4B, the length of the expandable mechanism 4c projecting from the first rotation mechanism 4a increases continuously from the left to the right as indicated by arrows in FIG. 4A.

The expandable mechanism 4c changes in length by projecting from or retracting into the first rotation mechanism 4a.

In this embodiment, although the case where the length of the expandable mechanism 4c projecting from the first rotation mechanism 4a changes continuously in accordance with changes in arrangement position of the first housing 2 with respect to the hinge 4 has been described as an example, the disclosure is not limited thereto, and the length of the expandable mechanism 4c projecting from the first rotation mechanism 4a may be configured to change step-by-step in accordance with the changes of the arrangement position of the first housing 2 with respect to the hinge 4.

As used herein the expression "the length of the expandable mechanism 4c projecting from the first rotation mechanism 4a changes step-by-step" is intended to include a situation that the length of the expandable mechanism 4c projecting from the first rotation mechanism 4a changes when the arrangement position of the first housing 2 with respect to the first rotation mechanism 4a of the hinge 4 becomes the position A in FIG. 4B, becomes the position B in FIG. 4C, and becomes the position C in FIG. 4D, but the length of the expandable mechanism 4c projecting from the first rotation mechanism 4a does not change during a transition, of the first housing 2, from the position A in FIG. 4B to the position B in FIG. 4C, and during a transition from the position B in FIG. 4C to the position C in FIG. 4D.

In this embodiment, although the case where the length of the expandable mechanism 4c projecting from the first rotation mechanism 4a changes in accordance with the change in arrangement position of the first housing 2 with respect to the hinge 4 has been described as an example, the disclosure is not limited thereto; as in a second embodiment described later, an expandable mechanism 4c' projecting from a second rotation mechanism 4b' may change in length in accordance with a change in an arrangement position of the second housing 3 with respect to a hinge 4', or as in a third embodiment described later, the length of an expandable mechanism 4c" may be determined by an arrangement position of the first housing 2 with respect to a hinge 4" and an arrangement position of a second housing 3 with respect to the hinge 4", and the lengths of the expandable mechanism 4c" projecting from each of the first rotation mechanism 4a" and a second rotation mechanism 4b" may change in accordance with the change in the arrangement position of the first housing 2 with respect to the hinge 4" and a change in the arrangement position of the second housing 3 with respect to the hinge 4".

Second Embodiment

A second embodiment of the disclosure will be described below with reference to FIGS. 5A to 5D. This embodiment differs from the first embodiment in that a length of the expandable mechanism 4c' projecting from the second rotation mechanism 4b' changes in accordance with a change in an arrangement position of the second housing 3 with respect to the hinge 4', and other configurations are the same as described in the first embodiment. For convenience of description, components having the same functions as the components illustrated in the drawings in conjunction with the first embodiment are denoted by the same reference numerals, and description thereof will be omitted.

Figure 5A:
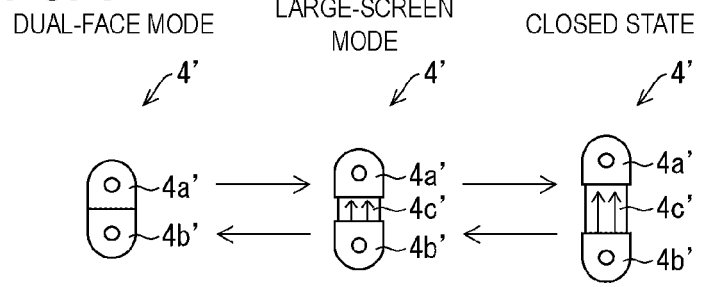
FIG. 5A is a drawing illustrating changes in length of the expandable mechanism of the hinge in cases where the information processing apparatus illustrated in FIGS. 1A and 1B is in the dual-face mode, the large-screen mode, and the closed state.
Figure 5B:
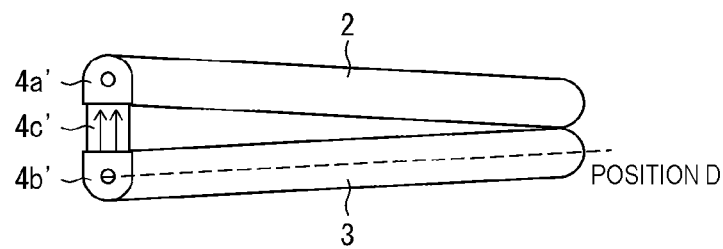
FIG. 5B is a drawing illustrating an arrangement position of the second housing with respect to a second rotation mechanism of the hinge in the case where the information processing apparatus is in the closed state.
Figure 5C:
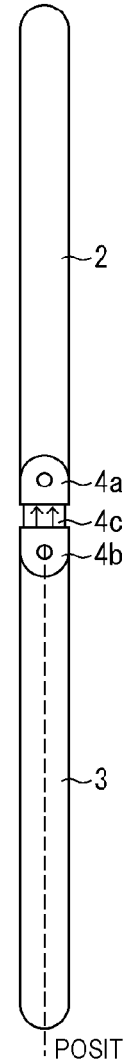
FIG. 5C is a drawing illustrating an arrangement position of the second housing with respect to the second rotation mechanism of the hinge in the case where the information processing apparatus is in the large-screen mode.
Figure 5D:
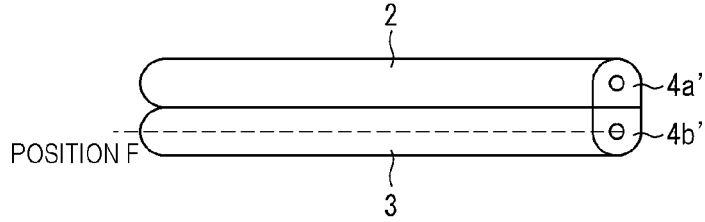
FIG. 5D is a drawing illustrating an arrangement position of the second housing with respect to the second rotation mechanism of the hinge in the case where the information processing apparatus is in the dual-face mode.

FIG. 5A is a drawing illustrating changes in length of the expandable mechanism 4c' of the hinge 4' in cases where the information processing apparatus is in the dual-face mode, the large-screen mode, and the closed state, FIG. 5B is a drawing illustrating an arrangement position of the second housing 3 with respect to the second rotation mechanism 4b' of the hinge 4' in the case where the information processing apparatus is in the closed state, FIG. 5C is a drawing illustrating an arrangement position of the second housing 3 with respect to the second rotation mechanism 4b' of the hinge 4' in the case where the information processing apparatus is in the large-screen mode, FIG. 5D is a drawing illustrating an arrangement position of the second housing 3 with respect to the second rotation mechanism 4b' of the hinge 4' in the case where the information processing apparatus is in the dual-face mode.

As illustrated in FIGS. 5A to 5D, the hinge 4' provided on the information processing apparatus of this embodiment is configured to determine the length of the expandable mechanism 4c' in accordance with the arrangement position of the second housing 3 with respect to the hinge 4' (the position D in FIG. 5B, the position E in FIG. 5C, and the position F in FIG. 5D) and the length of the expandable mechanism 4c' projecting from the second rotation mechanism 4b' changes continuously in accordance with a change in the arrangement position of the second housing 3 with respect to the hinge 4' as illustrated in FIG. 5A.

In other words, in a case where the arrangement position of the second housing 3 with respect to the second rotation mechanism 4b' of the hinge 4' changes from the position D in FIG. 5B through the position E in FIG. 5C to the position F in FIG. 5D, the length of the expandable mechanism 4c' projecting from the second rotation mechanism 4b' continuously decreases from the right to the left as indicated by arrows in FIG. 5A.

In contrast, in a case where the arrangement position of the second housing 3 with respect to the second rotation mechanism 4b' of the hinge 4' changes from the position F in FIG. 5D through the position E in FIG. 5C to the position D in FIG. 5B, the length of the expandable mechanism 4c' projecting from the second rotation mechanism 4b' increases continuously from the left to the right as indicated in arrows in FIG. 5A.

The expandable mechanism 4c' changes in length by projecting from and retracting into the second rotation mechanism 4b'.

This configuration realizes the information processing apparatus including the hinge 4' configured to continuously change the length of the expandable mechanism 4c' in accordance with the change in the arrangement position of the second housing 3 with respect to the hinge 4'.

In this embodiment, although the case where the length of the expandable mechanism 4c' projecting from the second rotation mechanism 4b' changes continuously in accordance with the change in the arrangement position of the second housing 3 with respect to the hinge 4' has been described, the disclosure is not limited thereto, and the length of the expandable mechanism 4c' projecting from the second rotation mechanism 4b' may be configured to change step-by-step in accordance with the change in the arrangement position of the second housing 3 with respect to the hinge 4'.

This configuration realizes the information processing apparatus including the hinge 4' configured to change the length of the expandable mechanism 4c' step-by-step in accordance with the arrangement position of the second housing 3 with respect to the hinge 4'.

Third Embodiment

A third embodiment of the disclosure will be described below with reference to FIGS. 6A and 6B and FIGS. 7A to 7D. This embodiment differs from the first and second embodiments in that the length of an expandable mechanism 4c" projecting from a first rotation mechanism 4a" and a second rotation mechanism 4b" changes in accordance with the change in an arrangement position of the first housing 2 with respect to a hinge 4" and the change in an arrangement position of the second housing 3 with respect to the hinge 4", that an information processing apparatus 10 includes a control circuit 9 configured to output a control signal in accordance with a selection of a user, and that the control circuit 9 is configured to control the arrangement position of the first housing 2 with respect to the hinge 4" and the arrangement position of the second housing 3 with respect to the hinge 4". Other configurations are the same as described in the first and second embodiments. For convenience of description, the components having the same functions as the components illustrated in the drawings in conjunction with the first and second embodiments are denoted by the same reference numerals and description thereof will be omitted.

Figure 6A:
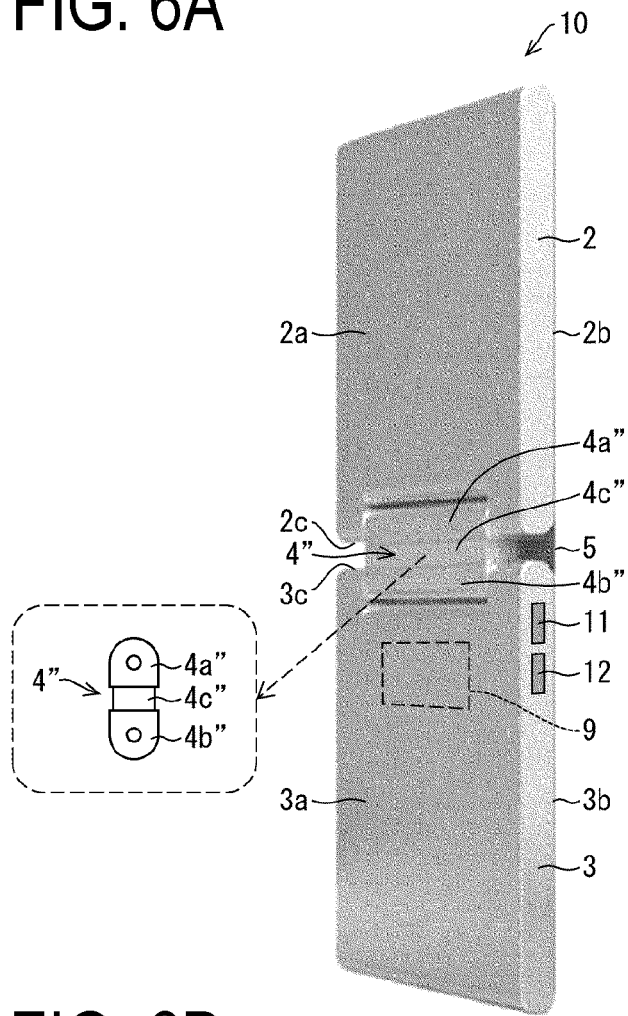
FIG. 6A is a drawing illustrating a case where another information processing apparatus including a flexible display panel is in a large-screen mode.
Figure 6B:
FIG. 6B is a drawing illustrating changes in length of the hinge in cases where the other information processing apparatus is in the dual-face mode, the large-screen mode, and the closed state.
Figure 6B:
Figure 6B:
Figure 6B:
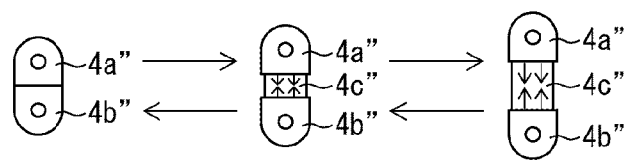

FIG. 6A is a drawing illustrating a case where the information processing apparatus 10 including the flexible display panel 5 is in the large-screen mode, and FIG. 6B is a drawing illustrating changes in length of the expandable mechanism 4c" of the hinge 4" in cases where the information processing apparatus 10 is in the dual-face mode, the large-screen mode, and the closed state.

The information processing apparatus 10 includes the hinge 4" configured to change the length of the expandable mechanism 4c" projecting from each of the first rotation mechanism 4a" and the second rotation mechanism 4b" in accordance with the change in the arrangement position of the first housing 2 with respect to the hinge 4" and the change in the arrangement position of the second housing 3 with respect to the hinge 4".

The the expandable mechanism 4c" changes in length by projecting from and retracting into the first rotation mechanism 4a" and the second rotation mechanism 4b".

The information processing apparatus 10 includes a control circuit 9 configured to output a control signal for controlling the arrangement position of the first housing 2 with respect to the hinge 4" and the arrangement position of the second housing 3 with respect to the hinge 4" in accordance with a selection by a user, more specifically, by the user pressing a first button 11 or a second button 12.

According to this embodiment, every time the user presses the first button 11, the information processing apparatus 10 transforms from the dual-face mode through the large-screen mode into the closed state, and every time the user presses the second button 13, the information processing apparatus 10 transforms from the closed state through the large-screen mode into the dual-face mode.

The lengths of the expandable mechanism 4c" of the hinge 4" in each of the closed state, the large-screen mode, and the dual-face mode of the information processing apparatus 10 are predetermined.

This configuration realizes the information processing apparatus 10 in which the arrangement position of the first housing 2 with respect to the hinge 4" and the relative position of the second housing 3 with respect to the hinge 4" can be controlled by the control circuit 9 configured to output the control signal in accordance with the selection by the user.

The hinges 4, 4', and 4" described above may be hinges having different modes, such as a hinge having a mode illustrated in FIG. 7 described below.

Figure 7A:
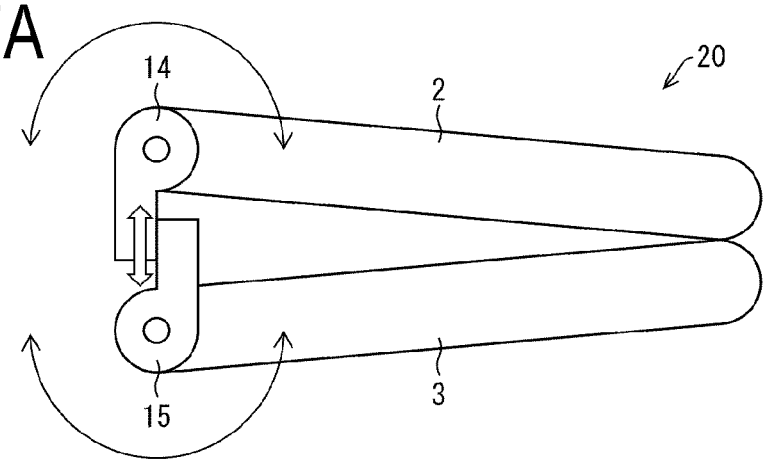
FIG. 7A is a drawing illustrating a schematic configuration of the information processing apparatus including another hinge.
Figure 7B:
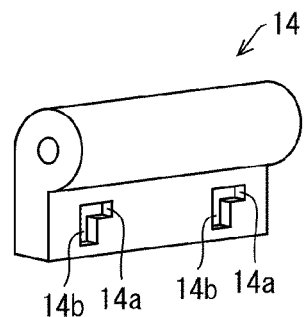
FIGS. 7B, 7C, and 7D are drawings illustrating a schematic configuration of the hinge.
Figure 7C:
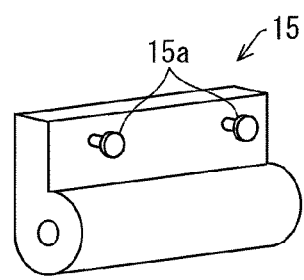
Figure 7D:
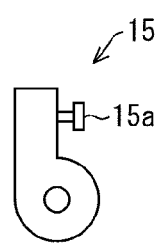
Figure 8A:
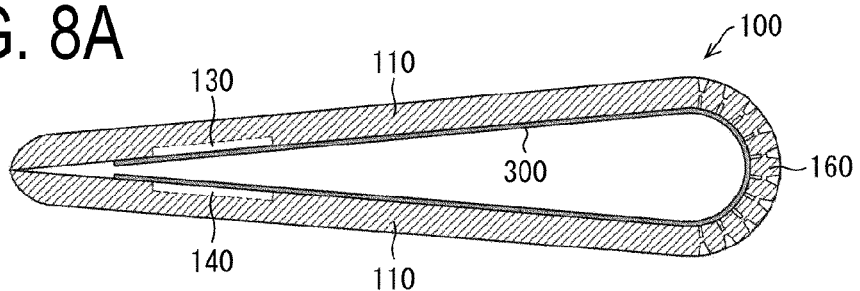
FIGS. 8A to 8D are drawings illustrating a schematic configuration of a flexible mobile terminal apparatus 100 including a flexible display panel 300 disclosed in PTL 1.
Figure 8B:
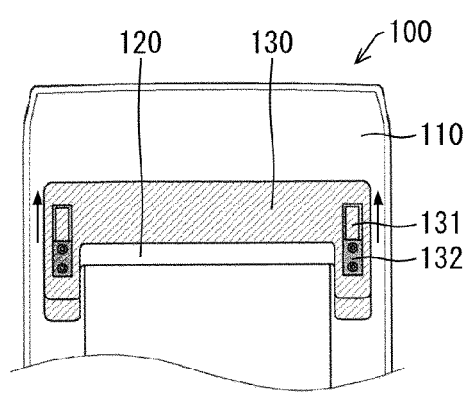
Figure 8C:
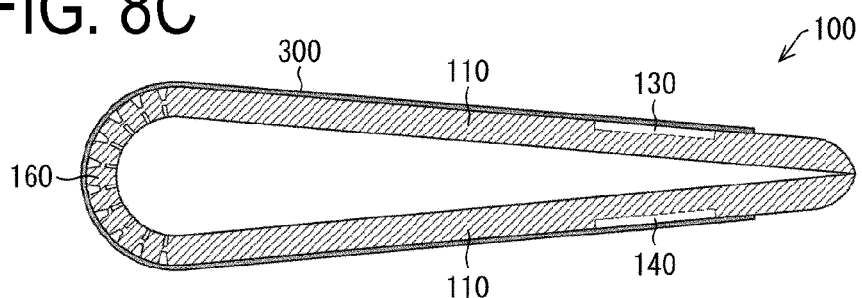
Figure 8D:
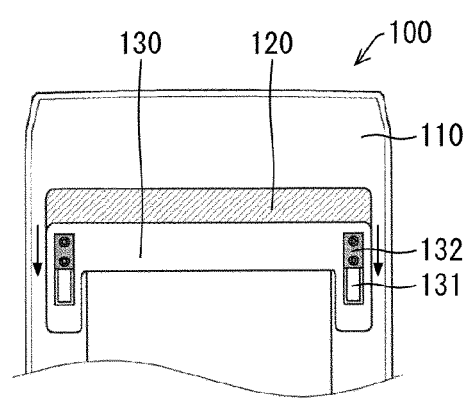

FIG. 7A is a drawing illustrating a schematic configuration of an information processing apparatus 20 including an upper hinge 14 and a lower hinge 15, and FIG. 7B, FIG. 7C, and FIG. 7D are drawings illustrating the schematic configuration of the upper hinge 14 and the lower hinge 15.

The information processing apparatus 20 including a flexible display panel (not illustrated) includes the upper hinge 14 coupled to the first housing 2 and the lower hinge 15 coupled to the second housing 3.

The upper hinge 14 and the lower hinge 15 each include rotation mechanisms. By moving the first housing 2 and the second housing 3 about rotation axes of the rotation mechanisms, the first housing 2 and the second housing 3 can be rotated with respect to the hinge including the upper hinge 14 and the lower hinge 15.

As illustrated in FIG. 7B, the the upper hinge 14 includes fitting holes 14a formed in a horizontal direction in the drawings and slide openings 14b formed in a vertical direction in the drawings. Each of the fitting holes 14a is connected to each of the slide openings 14b.

As illustrated in FIGS. 7C and 7D, the lower hinge 15 includes projections 15a. The projections 15a of the lower hinge 15 are fitted to the fitting holes 14a of the upper hinge 14 and slid in the slide openings 14b. Thus, the hinge including the lower hinge 15 and the upper hinge 14 realizes the expandable mechanism.

The sliding amount of the projections 15a of the lower hinge 15 in the slide openings 14b is determined based on the arrangement positions of the first housing 2 or the second housing 3 with respect to the upper hinge 14 and the lower hinge 15, and the sliding motion may be achieved by using an electric motor or the like.

Although the case where the upper hinge 14 includes the fitting holes 14a formed in the horizontal direction in the drawings and the slide openings 14b formed in the vertical direction in the drawing, and the lower hinge 15 includes the projections 15a is illustrated in FIG. 7, the disclosure is not limited thereto, and a configuration including the projections on the upper hinge 14 and the fitting holes and the slide openings in the lower hinge 15 is also applicable.

The flexible display body of this embodiment is not particularly limited as long as it has flexibility and includes a flexible display panel provided with a bendable electro-optic device. The electro-optic device described above is an electro-optic device in which brightness and transmission are controlled by an electric current. As the current-controlled electro-optic device, an organic Eelectro Luminescence (EL) display including Organic Light Emitting Diode (OLED), an EL display such as an inorganic EL display including an inorganic light emitting diode, or a Quantum dot Light Emitting Diode (QLED) display including QLED can be used.

Supplement

An information processing apparatus according to a first aspect of the disclosure is an information processing apparatus including a first housing; a second housing; a hinge configured to couple the first housing and the second housing; and a flexible display body disposed extending over and across a first face of the first housing and a second face of the second housing, wherein the hinge includes a first rotation mechanism provided at a portion to be coupled to the first housing, a second rotation mechanism provided at a portion to be coupled to the second housing, and an expandable mechanism configured to determine a distance between the first rotation mechanism and the second rotation mechanism, and a length of the expandable mechanism in a case where the first face of the first housing and the second face of the second housing are disposed facing each other is longer than a length of the expandable mechanism in a case where, a face, in the first housing, opposite the first face of the first housing where the flexible display body is provided, and a face, in the second housing, opposite the second face of the second housing where the flexible display body is provided, are disposed facing each other.

In this configuration, as the length of the expandable mechanism in the case where the first face of the first housing and the second face of the second housing are disposed facing each other is longer than the length of the expandable mechanism in the case where the face, in the first housing, opposite the first face of the first housing where the flexible display body is provided, and the face, in the second housing opposite the second face of the second housing where the flexible display body is provided are disposed facing each other, breakage of the flexible display body due to an excessive stress imparted on a bendable portion of the flexible display body disposed extending over and across the first face of the first housing and the second face of the second housing or due to an excessive tension applied to the flexible display body can be prevented.

In this configuration, as breakage of the flexible display body due to an excessive stress imparted on the bendable portion of the flexible display body disposed extending over and across the first face of the first housing and the second face of the second housing or due to an excessive tension applied to the flexible display body can be prevented by the hinge configured to couple the first housing and the second housing, the need for a mechanism for sliding the flexible display body may be eliminated, and unstable movement of the flexible display body may be avoided.

According to the information processing apparatus of a second aspect of the disclosure, in the first aspect, the length of the expandable mechanism is preferably longest in a case where the first face of the first housing and the second face of the second housing are partly in contact with each other.

In this configuration, breakage of the flexible display body disposed extending over and across the first face of the first housing and the second face of the second housing due to an excessive stress imparted on a bendable portion of the flexible display body can be prevented.

According to the information processing apparatus of a third aspect of the disclosure, in the first or second aspect, the length of the expandable mechanism is preferably shortest when a face, in the first housing, opposite the first face of the first housing where the flexible display body is provided, and a face, in the second housing, opposite the second face of the second housing where the flexible display body is provided, come into contact with each other.

In this configuration, breakage of the flexible display body disposed to extend over and across the first face of the first housing and the second face of the second housing is prevented from being easily broken due to the excessive tension applied thereto can be prevented.

According to the information processing apparatus of a fourth aspect of the disclosure, in any one of the first to third aspects, the length of the expandable mechanism in a case where the first housing and the second housing are disposed along a direction of change in the length of the expandable mechanism with the first face of the first housing and the second face of the second housing being parallel to each other is preferably shorter than the length of the expandable mechanism in a case where the first face of the first housing and the second face of the second housing are disposed facing each other, and is preferably longer than a length of the expandable mechanism in a case where a face, in the first housing, opposite the first face of the first housing where the flexible display body is provided, and a face, in the second housing, opposite the second face of the second housing where the flexible display body is provided, are disposed facing each other.

In this configuration, breakage of the flexible display body disposed extending over and across the first face of the first housing and the second face of the second housing due to an excessive stress imparted on the bendable portion of the flexible display body or due to an excessive tension applied to the flexible display body can be prevented.

According to the information processing apparatus of a fifth aspect of the disclosure, in any of the first to fourth aspects, the flexible display body is preferably fixed to the first housing and the second housing via adhesive layers provided on the first face of the first housing and the second face of the second housing.

In this configuration, as the flexible display body is fixed to the first housing and the second housing via the adhesive layers provided on the first face of the first housing and the second face of the second housing, an unstable movement of the flexible display body is avoided.

According to the information processing apparatus of a sixth aspect of the disclosure, in any one of the first to fifth aspects, the length of the expandable mechanism of the hinge may be determined by an arrangement position of the first housing with respect to the hinge, and the length of the expandable mechanism projecting from the first rotation mechanism may change continuously in accordance with a change in the arrangement position of the first housing with respect to the hinge.

This configuration may realize the information processing apparatus configured including the hinge configured to continuously change the length of the expandable mechanism in accordance with the arrangement position of the first housing with respect to the hinge.

According to the information processing apparatus of a seventh aspect of the disclosure, in any one of the first to fifth aspects, the length of the expandable mechanism of the hinge may be determined by the arrangement position of the first housing with respect to the hinge, and the length of the expandable mechanism projecting from the first rotation mechanism may change step-by-step in accordance with the change in relative position of the first housing with respect to the hinge.

This configuration may realize the information processing apparatus including the hinge configured to change the length of the expandable mechanism step-by-step in accordance with the arrangement position of the first housing with respect to the hinge.

According to the information processing apparatus of an eighth aspect of the disclosure, in any one of the first to fifth aspects, the length of the expandable mechanism of the hinge may be determined by an arrangement position of the second housing with respect to the hinge, and the length of the expandable mechanism projecting from the second rotation mechanism may change continuously in accordance with the change in the arrangement position of the second housing with respect to the hinge.

This configuration may realize the information processing apparatus including the hinge configured to continuously change the length of the expandable mechanism in accordance with the arrangement position of the second housing with respect to the hinge.

According to the information processing apparatus of a ninth aspect of the disclosure, in any of the first to fifth aspects, the length of the expandable mechanism may be determined by an arrangement position of the second housing with respect to the hinge, and the length of the expandable mechanism projecting from the second rotation mechanism may change step-by-step in accordance with the change in the arrangement position of the second housing with respect to the hinge.

This configuration may realize the information processing apparatus including the hinge configured to change the length of the expandable mechanism step-by-step in accordance with the arrangement position of the second housing with respect to the hinge.

According to the information processing apparatus of a tenth aspect of the disclosure, in any one of the first to fifth aspects, the length of the expandable mechanism of the hinge may be determined by an arrangement position of the first housing with respect to the hinge and an arrangement position of the second housing with respect to the hinge, and the length of the expandable mechanism projecting from the first rotation mechanism an the second rotation mechanism may change continuously in accordance with a change in the arrangement position of the first housing with respect to the hinge and a change in the arrangement position of the second housing with respect to the hinge.

This configuration may realize the information processing apparatus including the hinge configured to continuously change the length of the expandable mechanism in accordance with the arrangement position of the first housing with respect to the hinge and the arrangement position of the second housing with respect to the hinge.

According to the information processing apparatus of an eleventh aspect of the disclosure, in any one of the first to fifth aspect, the length of the expandable mechanism of the hinge may be determined by an arrangement position of the first housing with respect to the hinge and an arrangement position of the second housing with respect to the hinge, and the length of the expandable mechanism projecting from the first rotation mechanism and the second rotation mechanism may change step-by-step in accordance with a change in the arrangement position of the first housing with respect to the hinge and a change in the arrangement position of the second housing with respect to the hinge.

This configuration may realize the information processing apparatus including the hinge configured to change the length of the expandable mechanism step-by-step in accordance with the arrangement position of the first housing with respect to the hinge and the arrangement position of the second housing with respect to the hinge.

According to the information processing apparatus of a twelfth aspect of the disclosure, in any one of the first to eleventh aspects, the arrangement position of the first housing with respect to the hinge and the arrangement position of the second housing with respect to the hinge may be controlled by a control circuit configured to output a control signal in accordance with a selection by a user.

This configuration may realize the information processing apparatus in which the arrangement position of the first housing with respect to the hinge and the arrangement position of the second housing with respect to the hinge are controlled by the control circuit configured to output a control signal in accordance with selection by the user.

According to the information processing apparatus of a thirteenth aspect of the disclosure, in the second aspect, an edge of the first face of the first housing on a side farther from the hinge and an edge of the second face of the second housing on a side farther from the hinge may come into contact with each other and a portion of the first face of the first housing on a side closer to the hinge and a portion of the second face of the second housing on a side closer to the hinge may not contact each other and may form a cavity.

In this configuration, breakage of the flexible display body disposed extending over and across the first face of the first housing and the second face of the second housing due to an excessive stress imparted on a bendable portion of the flexible display body can be prevented.

According to the information processing apparatus of a fourteenth aspect of the disclosure, in any one of the first to thirteenth aspects, the flexible display body may include a flexible organic EL panel.

This configuration realizes the information processing apparatus including the flexible organic EL panel as the flexible display body.

According to the information processing apparatus of a fifteenth aspect of the disclosure, in any one of the first to thirteenth aspects, the flexible display body may include a flexible reflective liquid crystal display panel.

This configuration may realize the information processing apparatus including the flexible reflective liquid crystal display panel as the flexible display body.

Notes

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

INDUSTRIAL APPLICABILITY

The disclosure may be used for an information processing apparatus including a flexible display body (flexible display panel).

REFERENCE SIGNS LIST

1 Information processing apparatus
2 First housing
2a Back face of first face of first housing (face opposite first face of first housing)
2b First face of first housing
2c Side face of first housing on hinge side
3a Back face of second face of second housing (face opposite second face of second housing)
3b Second face of second housing
3c Side face of second housing on hinge side
4 Hinge
4a First rotation mechanism
4b Second rotation mechanism
4c Expandable mechanism
4' Hinge
4a' First rotation mechanism
4b' Second rotation mechanism
4c' Expandable mechanism
4" Hinge
4a" First rotation mechanism
4b" Second rotation mechanism
4c" Expandable mechanism
5 Flexible display panel (flexible display body)
6 Contact portion
7 Cavity
9 Control circuit
10 Information processing apparatus
11 First button
12 Second button
14 Upper hinge portion
15 Lower hinge portion
20 Information processing apparatus

The invention claimed is:

1. An information processing apparatus comprising:
a first housing;
a second housing;
a hinge configured to couple the first housing and the second housing; and
a flexible display body disposed extending over and across a first face of the first housing and a second face of the second housing,
wherein the hinge includes:
a first rotation mechanism provided at a portion to be coupled to the first housing;
a second rotation mechanism provided at a portion to be coupled to the second housing; and
an expandable mechanism configured to determine a distance between the first rotation mechanism and the second rotation mechanism, and
a length of the expandable mechanism in a case where the first face of the first housing and the second face of the second housing are disposed facing each other is longer than a length of the expandable mechanism in a case where a face, in the first housing, opposite the first face of the first housing where the flexible display body is provided, and a face, in the second housing, opposite the second face of the second housing where the flexible display body is provided, are disposed facing each other.

2. The information processing apparatus according to claim 1,
wherein the length of the expandable mechanism is longest in a case where the first face of the first housing and the second face of the second housing are partly in contact with each other.

3. The information processing apparatus according to claim 1,
wherein the length of the expandable mechanism is shortest in a case where a face, in the first housing, opposite the first face of the first housing where the flexible display body is provided, and a face, in the second housing, opposite the second face of the second housing where the flexible display body is provided, come into contact with each other.

4. The information processing apparatus according to claim 1,
wherein the length of the expandable mechanism in a case where the first housing and the second housing are disposed along a direction of change in length of the expandable mechanism with the first face of the first housing and the second face of the second housing being parallel to each other is shorter than the length of the expandable mechanism in a case where the first face of the first housing and the second face of the second housing are disposed facing each other, and is longer than the length of the expandable mechanism in a case where the face, in the first housing, opposite the first face of the first housing where the flexible display body is provided, and the face, in the second housing, opposite the second face of the second housing where the flexible display body is provided are disposed facing each other.

5. The information processing apparatus according to claim 1, wherein the flexible display body is fixed to the first housing and the second housing via adhesive layers provided on the first face of the first housing and the second face of the second housing.

6. The information processing apparatus according to claim 1,
wherein the length of the expandable mechanism of the hinge is determined by an arrangement position of the first housing with respect to the hinge, and
the length of the expandable mechanism projecting from the first rotation mechanism changes continuously in accordance with a change in the arrangement position of the first housing with respect to the hinge.

7. The information processing apparatus according to claim 1,
wherein the length of the expandable mechanism of the hinge is determined by an arrangement position of the first housing with respect to the hinge, and
the length of the expandable mechanism projecting from the first rotation mechanism changes step-by-step in accordance with a change in the arrangement position of the first housing with respect to the hinge.

8. The information processing apparatus according to claim 1,
wherein the length of the expandable mechanism of the hinge is determined by an arrangement position of the second housing with respect to the hinge, and
the length of the expandable mechanism projecting from the second rotation mechanism changes continuously in accordance with a change in the arrangement position of the second housing with respect to the hinge.

9. The information processing apparatus according to claim 1,
wherein the length of the expandable mechanism of the hinge is determined by an arrangement position of the second housing with respect to the hinge, and
the length of the expandable mechanism projecting from the second rotation mechanism changes step-by-step in accordance with a change in the arrangement position of the second housing with respect to the hinge.

10. The information processing apparatus according to claim 1,
wherein the length of the expandable mechanism of the hinge is determined by an arrangement position of the first housing with respect to the hinge and an arrangement position of the second housing with respect to the hinge, and
the length of the expandable mechanism projecting from the first rotation mechanism and the second rotation mechanism changes continuously in accordance with a change in the arrangement position of the first housing and a change in the arrangement position of the second housing with respect to the hinge.

11. The information processing apparatus according to claim 1,
wherein the length of the expandable mechanism of the hinge is determined by an arrangement position of the first housing with respect to the hinge and an arrangement position of the second housing with respect to the hinge, and
the length of the expandable mechanism projecting from the first rotation mechanism and the second rotation mechanism changes step-by-step in accordance with a change in the arrangement position of the first housing with respect to the hinge and the arrangement position of the second housing with respect to the hinge.

12. The information processing apparatus according to claim 1,
wherein the arrangement position of the first housing with respect to the hinge and the arrangement position of the second housing with respect to the hinge are controlled by a control circuit configured to output a control signal in accordance with a selection by a user.

13. The information processing apparatus according to claim 2,
- wherein an edge of the first face of the first housing on a side farther from a hinge and an edge of the second face of the second housing on the side farther from the hinge come into contact with each other, and
- a portion of the first face of the first housing on a side closer to the hinge and a portion of the second face of the second housing on the side closer to the hinge do not contact each other and form a cavity.

14. The information processing apparatus according to claim 1,
- wherein the flexible display body includes a flexible organic EL panel.

15. The information processing apparatus according to claim 1,
- wherein the flexible display body includes a flexible reflective liquid crystal display panel.

\* \* \* \* \*